United States Patent
Huott et al.

(10) Patent No.: US 7,275,194 B2
(45) Date of Patent: Sep. 25, 2007

(54) CLOCK DUTY CYCLE BASED ACCESS TIMER COMBINED WITH STANDARD STAGE CLOCKED OUTPUT REGISTER

(75) Inventors: William V. Huott, Holmes, NY (US); Pradip Patel, Poughkeepsie, NY (US); Daniel Rodko, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 277 days.

(21) Appl. No.: 11/057,318

(22) Filed: Feb. 11, 2005

(65) Prior Publication Data

US 2006/0195740 A1    Aug. 31, 2006

(51) Int. Cl.
G01R 31/28    (2006.01)
(52) U.S. Cl. .................. 714/731; 714/724; 714/744
(58) Field of Classification Search ......... 714/724–731
See application file for complete search history.

(56) References Cited

U.S. PATENT DOCUMENTS

2003/0196150 A1* 10/2003 Linam et al. ............... 714/724

OTHER PUBLICATIONS

IBM, Integer Divisible Frequency Divider with Symmetric Outputs, May 1, 1996, IBM Technical Disclosure Bulletin, May 1996 vol. 39, pp. 187-188.*
IBM, Test Bus Architecture, Aug. 1, 1989, IBM Technical Disclosure Bulletin, Aug. 1989, vol. 32, pp. 21-27.*

* cited by examiner

Primary Examiner—James C. Kerveros
Assistant Examiner—Saquib J Siddiqui
(74) Attorney, Agent, or Firm—Lynn L. Augspurger; Richard M. Goldman

(57) ABSTRACT

An output of an element under test is captured and stored, through a multiplexer, in a capture register. At a clock edge (either rising or falling edge) the element under test catches the "edge" and "strobes" the output. The multiplexer is strobed, and the delay and duty cycle are measured. Both the rising and falling edge are used as the timer.

8 Claims, 2 Drawing Sheets

DC MODE

AC MODE

CLOCK DUTY CYCLE BASED ACCESS TIMER COMBINED WITH STANDARD STAGE CLOCKED OUTPUT REGISTER

BACKGROUND

1. Field of the Invention

The invention relates to built in test circuitry having a clock duty cycle based access timer combined with standard stage clocked output register.

2. Background Art

When performing maximum frequency (f max) analysis on microprocessors, testers can simply increase the global clock frequency until the system fails. This does not give good insight into the maximum frequency or the maximum performance of the individual parts of the microprocessor or even the amount of guard band that is built into a microprocessor or integrated circuit. Increasing the frequency only tells you the f max of the slowest component.

By way of exemplification, one such critical component is the SRAM and another such critical component is a logic unit.

In addition to knowing the maximum sustainable frequency of the element, it is often important to know the true data access times of the elements on a chip.

Elaborate clock choppers have been used in the past, but these circuits can be quite large and take up valuable real estate. In the case of a SRAM, such large circuitry would need to be placed outside of the SRAM macro. Placing such critical timing circuits away from the element under test will result in inaccurate timing results. Thus, a need exists for a more compact solution to track timing delays in circuit elements.

SUMMARY OF THE INVENTION

According to the disclosed invention the output of the element under test is captured and stored in a capture register. Specifically, according to the invention described herein, a MUX (multiplexer) is used instead of the cumbersome built in delay clock of the prior art. The programmable delay associated with the delay clock is replaced with a MUX, and at a clock edge (either rising or falling edge) the grid (element under test) catches the "edge" and "strobes" the output. The MUX is strobed, and the delay and duty cycle are measured. Both the rising and falling edge are used as the timer.

The invention involves changing the capture clock strobe timing of the output capture register of the circuit element under test such that the relative access time of the element can be measured. The technique for adjusting this strobe timing can be done with the duty cycle of the clock instead of using elaborate programmable clock choppers. A correct signature in the output register for the circuit element under test is known.

Then, the duty cycle of the global clock will be decreased until the capture register fails to receive the output of the circuit element under test. The method and system of our invention is advantageous due to the fact that the circuit element is compact, taking up little real estate, and fitting within the macro of the circuit element under test. Moreover, the test circuit is a simple circuit with little delay. This is in direct contrast to large clock choppers and oscillators.

Moreover, the duty cycle based access time circuit can be used as a normal cycle staged clock with applying stress to the access time.

THE FIGURES

Various embodiments and exemplifications of our invention are shown in the Figures appended hereto.

DETAILED DESCRIPTION

Figure 1:
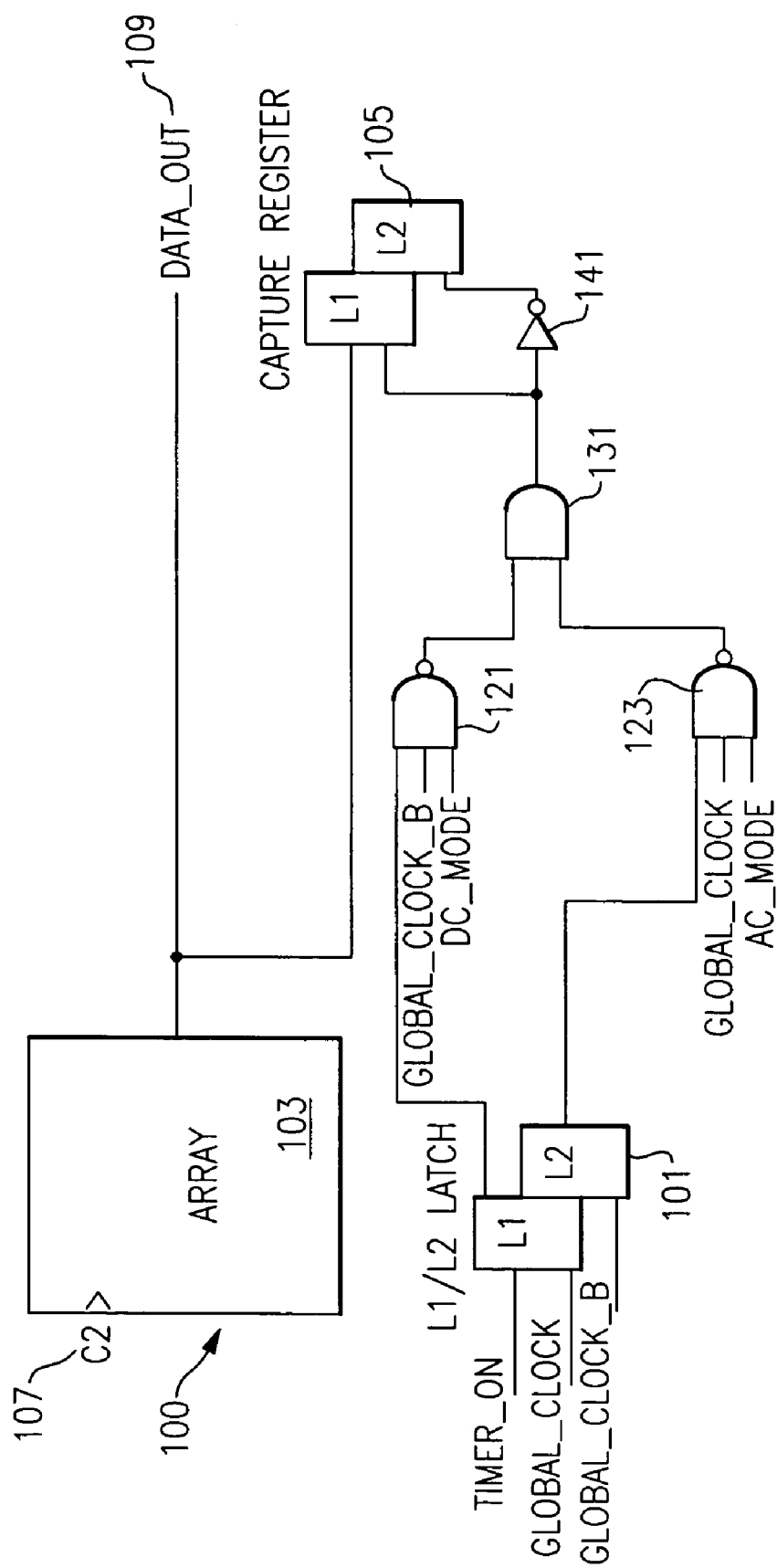
FIG. 1 illustrates an array access timer as described herein, with an array, having an L1/L2 latch, logic, and L1/L2 capture registers.

A built in test circuit 111 is shown in FIG. 1. The test circuit has a clock duty cycle based access timer combined with standard stage clocked output register. As shown in FIG. 1, the circuit 100, including the circuit element under test 103 and the test circuit includes a clock input 107 and outputs a data output 109. The data out 109 is compared with the content of the capture register 105.

The element under test may be a memory element, as a SRAM, or any other digital element.

A "strobe on/off" L1/L2 latch pair 101 waits to receive a signal to activate the timer. The timer includes two NAND circuits, 121 and 123. The DC mode timer receives as its inputs a signal from the L1 latch of the L1/L2 latch 101, a global_clock_b input, and a dc_mode control signal. The AC mode timer, NAND gate 123, receives a control signal from the L2 latch of the L1/L2 latch 101, a global_clock signal, and an ac_mode control signal. The signals from the timers 121 and 123 are input to NAND gate 131. The output of NAND gate 131 is input, along with the signal from the circuit element under test, to the L1 latch of the capture register 105, and as an inverted input 141 to the L2 latch of the Capture Register 105. The timer has two modes of operation, DC mode, having the timing diagram shown in FIG. 2, and AC mode having the timing diagram shown in FIG. 3.

Figure 2:
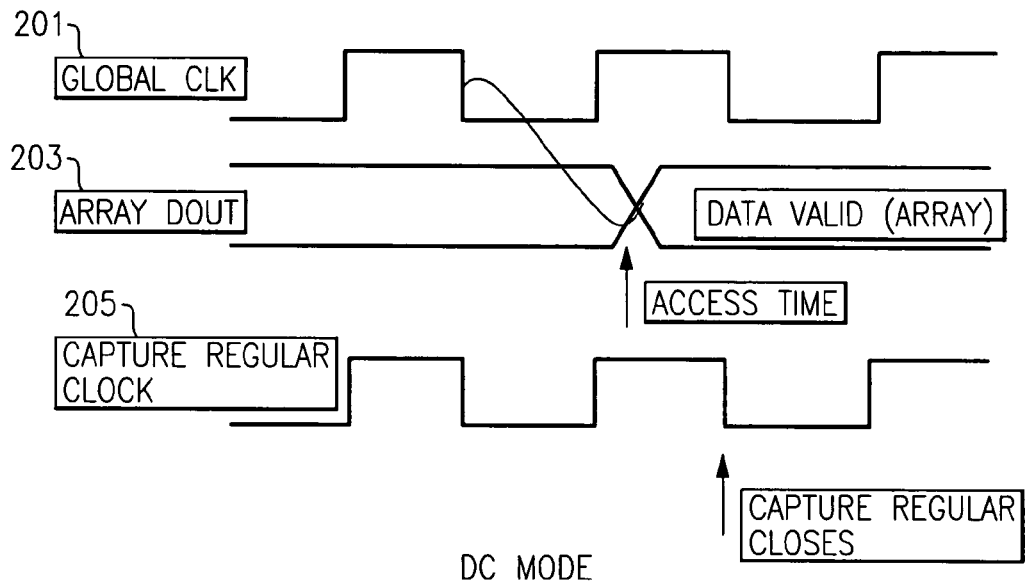
FIG. 2 illustrates a timing diagram for DC mode operation of the test circuit.

In the DC mode, FIG. 2, the timer will clock the capture well after the data from the circuit element 103 under test has reached the input of the capture register 105. In the DC mode the Capture Register 105 acts like a normal staged register such that its clock (strobe) closes on a normal cycle time boundary. No AC timing measurements can be made in this mode other then cycle time f max.

In the DC mode, in effect, the capture register 105 is clocked by the global_clock with some amount of delay. The input and outputs are as shown in FIG. 2, with global_clock output 201, array d_out 203, and capture regular_clock 205.

Figure 3:
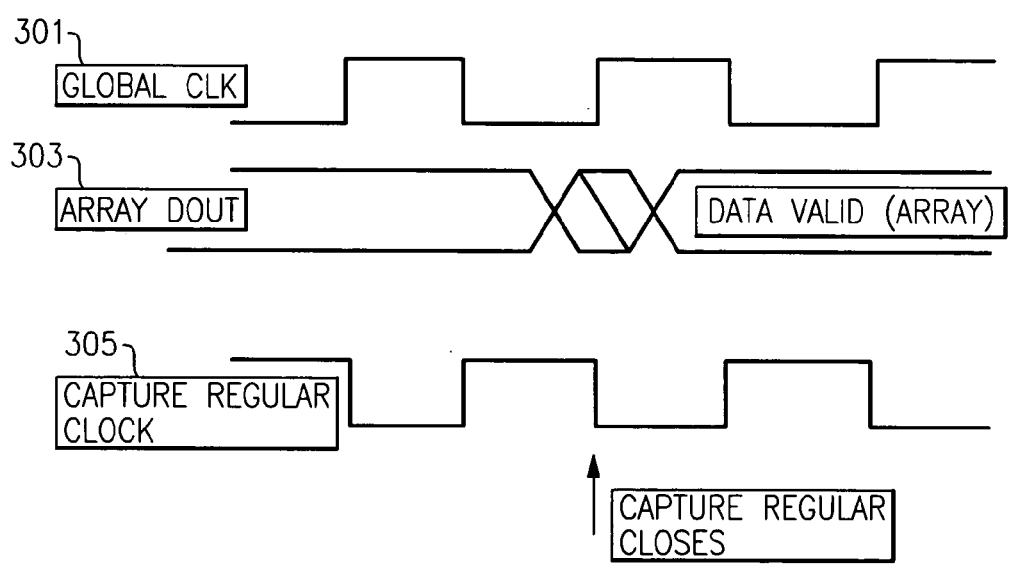
FIG. 3 illustrates a timing diagram for AC mode operation of the test circuit.

The second mode is the AC mode, with the inputs and output shown in FIG. 3, which will allow for the access time measurement. The timer_on signal will be sent from the L2 portion of the "Strobe On/Off" latch on the falling edge of the global_clock (i.e., the inverted global_clock) will be used to clock the capture register 105. The input and outputs are as shown in FIG. 3, with global_clock output 301, array d_out 303, and capture regular_clock 305.

This means the mid-cycle edge of the clock (the duty cycle dependent edge) is used to strobe the closing of the capture register latch. This clock signal should reach the capture register at approximately the same time as the data output of the circuit element under test when the access time of the circuit element under test is being measured at its limit. Through the use of a tester or the already existing clock circuitry on the chip, the duty cycle of the global_ clock can be manipulated. In fact this can usually be done by just changing the frequency of a 50% duty cycle clock. This is because the access time of the element under test is usually longer then one half of the cycle time f max of the circuit element.

In this case, in order to measure the access time of the element under test in the AC mode, the cycle time of the clock is actually slowed down until the timing of the mid-cycle edge of the global_clock equals the access time of the circuit element under test.

Either way, the falling edge of the global_clock_b can be adjusted until the capture register 105 reaches its pass/fail point. By examining timing of the global_clock mid-cycle edge, an access time range can be simply calculated. Even if a means doesn't exist to find an accurate absolute timing of the mid-cycle edge, the relative point of failure for the circuit element and/or individual addresses and bits in the element can be measured for "outlier" timing defects.

The method described herein measures access time without complicated clock chopper circuit logic and the concomitant area usage.

While the invention has been described with respect to certain preferred exemplifications and embodiments, it is not intended to limit the scope of the invention thereby, but solely by the claims appended hereto.

We claim:

1. A method of testing a circuit element under test comprising:
   generating a clocked test signal;
   decreasing the duty cycle of the clocked test signal until the capture register fails to receive the output of the circuit element under test;
   capturing an output of the element under test in a capture register at a clock edge through a multiplexer, wherein the element under test catches the clock edge and strobes an output, thereby strobing the multiplexer, said multiplexer comprising;
   a strobe on/off latch pair for capturing a TIMER_ON signal, a GLOBAL_CLOCK signal, and a GLOBAL CLOCK B signal, wherein the multiplexer outputs a signal to a DC MODE NAND gate and a signal to an AC MODE NAND gate;
   wherein the DC MODE NAND gate receives the GLOBAL CLOCK B signal and a DC MODE signal;
   wherein the AC MODE NAND gate receives the GLOBAL CLOCK signal and an AC MODE signal; and
   wherein the AC MODE NAND gate and the DC MODE NAND gate outputs being NANDED to an input of a capture register to thereby multiplex the AC mode and the DC mode of the capture register for comparison with a data output of the circuit element under test.

2. The method of claim 1 comprising capturing the delay and duty cycle.

3. The method of claim 1 comprising strobing the circuit element under test on the rising edge of the clocked test signal.

4. The method of claim 1 comprising strobing the circuit element under test on the falling edge of the clocked test signal.

5. The method of claim 1 comprising changing the capture clock strobe timing of the output capture register of the circuit element under test to thereby measure the relative access time of the element under test.

6. A circuit comprising:
   an element to be tested and built in test circuitry including;
   a clocked output register, a multiplexer, a strobe on/off L1/L2 latch pair and a clock duty cycle based access timer, said access timer receiving a signal from the L1/L2 latch pair;
   the access timer comprising two NAND circuits, said NAND circuits receiving timing and mode signals as inputs,
   wherein said multiplexer receives a signal from said access timer, from the circuit under test and a capture register, said multiplexer comprising;
   a strobe on/off latch pair for capturing a TIMER_ON signal, a GLOBAL_CLOCK signal, and a GLOBAL CLOCK B signal, wherein the multiplexer outputs a signal to a DC MODE NAND gate and a signal to an AC MODE NAND gate;
   wherein the DC MODE NAND gate receives the GLOBAL CLOCK B signal and a DC MODE signal;
   wherein the AC MODE NAND gate receives the GLOBAL CLOCK signal and an AC MODE signal;
   wherein the AC MODE NAND gate and the DC MODE NAND gate outputs being NANDED to an input of a capture register to thereby multiplex the AC mode and the DC mode of the capture register for comparison with a data output of the circuit element under test.

7. The circuit of claim 6 wherein the element to be tested is a SRAM.

8. The circuit of claim 6 wherein the element to be tested is a logic element.

* * * * *